United States Patent
Hsu et al.

(10) Patent No.: US 8,461,045 B2
(45) Date of Patent: *Jun. 11, 2013

(54) BOND PAD CONNECTION TO REDISTRIBUTION LINES HAVING TAPERED PROFILES

(75) Inventors: Kuo-Ching Hsu, Taipei (TW); Chen-Shien Chen, Zhubei (TW); Hon-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

This patent is subject to a terminal disclaimer.

(21) Appl. No.: 13/050,424

(22) Filed: Mar. 17, 2011

(65) Prior Publication Data

US 2011/0165776 A1      Jul. 7, 2011

Related U.S. Application Data

(63) Continuation of application No. 12/347,742, filed on Dec. 31, 2008, now Pat. No. 7,928,534.

(60) Provisional application No. 61/104,186, filed on Oct. 9, 2008.

(51) Int. Cl.
 *H01L 21/44* (2006.01)
 *H01L 29/41* (2006.01)
 *H01L 21/768* (2006.01)

(52) U.S. Cl.
 USPC ............... 438/667; 257/621; 257/E23.168; 257/E23.011

(58) Field of Classification Search
 USPC ............ 438/667; 257/621, E23.168, E23.011
 See application file for complete search history.

(56) References Cited

U.S. PATENT DOCUMENTS

| | | |
|---|---|---|
| 3,461,357 A | 8/1969 | Mutter et al. |
| 4,005,472 A | 1/1977 | Harris et al. |
| 5,391,917 A | 2/1995 | Gilmour et al. |

(Continued)

FOREIGN PATENT DOCUMENTS

| | | |
|---|---|---|
| JP | 2000-188357 A | 7/2000 |
| JP | 2001-257310 A | 9/2001 |

(Continued)

OTHER PUBLICATIONS

Shen, L.-C., et al., "A Clamped Through Silicon Via (TSV) Interconnection for Stacked Chip Bonding Using Metal Cap on Pad and Metal Column Forming in Via," Electronic Components and Technology Conference, 2008, pp. 544-549.

*Primary Examiner* — Evan Pert
(74) *Attorney, Agent, or Firm* — Slater & Matsil, L.L.P.

(57) ABSTRACT

An integrated circuit structure includes a semiconductor substrate having a front side and a backside. A through-silicon via (TSV) penetrates the semiconductor substrate, wherein the TSV has a back end extending to the backside of the semiconductor substrate. A redistribution line (RDL) is formed over the backside of the semiconductor substrate and connected to the back end of the TSV. A passivation layer is over the RDL with an opening formed in the passivation layer, wherein a portion of a top surface of the RDL and a sidewall of the RDL are exposed through the opening. A metal finish is formed in the opening and contacting the portion of the top surface and the sidewall of the RDL.

20 Claims, 6 Drawing Sheets

U.S. PATENT DOCUMENTS

| | | | |
|---|---|---|---|
| 5,510,298 A | 4/1996 | Redwine | |
| 5,767,001 A | 6/1998 | Bertagnolli et al. | |
| 5,897,362 A | 4/1999 | Wallace | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,376,332 B1 | 4/2002 | Yanagita et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,566,239 B2 | 5/2003 | Makino et al. | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,765,299 B2 | 7/2004 | Takahashi et al. | |
| 6,800,930 B2 * | 10/2004 | Jackson et al. | 257/700 |
| 6,841,883 B1 | 1/2005 | Farnworth et al. | |
| 6,882,030 B2 | 4/2005 | Siniaguine | |
| 6,897,125 B2 | 5/2005 | Morrow et al. | |
| 6,924,551 B2 | 8/2005 | Rumer et al. | |
| 6,936,923 B2 | 8/2005 | Lin et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,271,483 B2 | 9/2007 | Lin et al. | |
| 7,291,542 B2 | 11/2007 | Iwamatsu et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,371,663 B2 | 5/2008 | Chen et al. | |
| 7,378,732 B2 | 5/2008 | Yamano et al. | |
| 7,524,753 B2 | 4/2009 | Sunohara et al. | |
| 7,569,935 B1 | 8/2009 | Fan | |
| 7,713,861 B2 | 5/2010 | Yu | |
| 7,786,584 B2 | 8/2010 | Barth et al. | |
| 7,804,177 B2 | 9/2010 | Lu et al. | |
| 7,838,337 B2 | 11/2010 | Marimuthu et al. | |
| 7,863,739 B2 | 1/2011 | Lee et al. | |
| 7,902,679 B2 | 3/2011 | Lin et al. | |
| 7,928,534 B2 | 4/2011 | Hsu et al. | |
| 7,956,442 B2 | 6/2011 | Hsu et al. | |
| 8,097,964 B2 | 1/2012 | West et al. | |
| 8,158,489 B2 | 4/2012 | Huang et al. | |
| 8,264,077 B2 | 9/2012 | Chiou et al. | |
| 8,288,872 B2 | 10/2012 | Chen et al. | |
| 2002/0121692 A1 | 9/2002 | Lee et al. | |
| 2004/0151917 A1 | 8/2004 | Chen et al. | |
| 2005/0176235 A1 | 8/2005 | Noma et al. | |
| 2005/0212133 A1 | 9/2005 | Barnak et al. | |
| 2005/0236693 A1 | 10/2005 | Kroninger et al. | |
| 2006/0014320 A1 | 1/2006 | Yamano et al. | |
| 2006/0046431 A1 | 3/2006 | Blietz et al. | |
| 2006/0099791 A1 | 5/2006 | Mitani et al. | |
| 2007/0210259 A1 | 9/2007 | Kerwin et al. | |
| 2008/0023850 A1 | 1/2008 | Lu et al. | |
| 2008/0035854 A1 | 2/2008 | Jin et al. | |
| 2008/0054459 A1 | 3/2008 | Lee et al. | |
| 2008/0057678 A1 | 3/2008 | Gadkaree et al. | |
| 2008/0079121 A1 | 4/2008 | Han | |
| 2008/0083985 A1 | 4/2008 | Lee et al. | |
| 2008/0131679 A1 | 6/2008 | Nakai et al. | |
| 2008/0258299 A1 | 10/2008 | Kang et al. | |
| 2009/0098724 A1 | 4/2009 | Yu | |
| 2009/0102021 A1 | 4/2009 | Chen et al. | |
| 2009/0140381 A1 | 6/2009 | Lin et al. | |
| 2009/0267213 A1 | 10/2009 | Lin et al. | |
| 2010/0009318 A1 | 1/2010 | Kim | |
| 2010/0013102 A1 | 1/2010 | Tay et al. | |
| 2010/0022034 A1 | 1/2010 | Antol et al. | |
| 2010/0090318 A1 | 4/2010 | Hsu et al. | |
| 2010/0090319 A1 | 4/2010 | Hsu et al. | |
| 2010/0244241 A1 | 9/2010 | Marimuthu et al. | |
| 2010/0252934 A1 | 10/2010 | Law et al. | |
| 2010/0276787 A1 | 11/2010 | Yu et al. | |
| 2010/0320575 A9 | 12/2010 | Chauhan | |
| 2010/0330798 A1 | 12/2010 | Huang et al. | |
| 2011/0049706 A1 | 3/2011 | Huang et al. | |
| 2011/0186990 A1 | 8/2011 | Mawatari et al. | |
| 2011/0193235 A1 | 8/2011 | Hu et al. | |
| 2011/0233785 A1 | 9/2011 | Koester et al. | |
| 2011/0248404 A1 | 10/2011 | Chiu et al. | |
| 2011/0291259 A9 | 12/2011 | Huang et al. | |

FOREIGN PATENT DOCUMENTS

| | | |
|---|---|---|
| JP | 2002-190550 A | 7/2002 |
| JP | 2004-319707 A | 11/2004 |
| JP | 2006-351968 A | 12/2006 |
| JP | 2007-067211 A | 3/2007 |
| JP | 2008-258445 A | 10/2008 |

* cited by examiner

BOND PAD CONNECTION TO REDISTRIBUTION LINES HAVING TAPERED PROFILES

This application is a continuation of U.S. patent application Ser. No. 12/347,742, entitled "Bond Pad Connection to Redistribution Lines Having Tapered Profiles," filed on Dec. 31, 2008, which application claims the benefit of the following provisionally filed U.S. patent application: Application Ser. No. 61/104,186, filed Oct. 9, 2008, and entitled "Bond Pads Contacting Sidewalls of RDL for Reliable TSV Connection," which applications are hereby incorporated herein by reference.

TECHNICAL FIELD

This invention relates generally to integrated circuit structures, and more particularly to through-silicon vias, and even more preferably to the formation of bond pads connected to the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuits (3DICs) and stacked dies are commonly used. Through-silicon vias (TSVs) are thus used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

FIG. 1 illustrates a conventional TSV 102 formed in chip 104. TSV 102 is in silicon substrate 106. Through the interconnections (metal lines and vias, not shown) in the metallization layers, TSV 102 is electrically connected to bond pad 108, which is on the front surface of chip 104. TSV 102 is exposed through the back surface of substrate 106 in the form of a copper post. When chip 104 is bonded to another chip, TSV 102 is bonded to a bond pad on the other chip, with or without solder therebetween. This scheme suffers from drawbacks. Since the TSV bonding requires relatively large pitch between TSVs, the location of the TSVs are restricted and the distance between the TSVs needs to be big enough to allow room for, for example, solder balls. New backside structures are thus needed.

SUMMARY OF THE INVENTION

In accordance with one aspect of the present invention, an integrated circuit structure includes a semiconductor substrate having a front side and a backside. A through-silicon via (TSV) penetrates the semiconductor substrate, wherein the TSV has a back end extending to the backside of the semiconductor substrate. A redistribution line (RDL) is formed over the backside of the semiconductor substrate and connected to the back end of the TSV. A passivation layer is over the RDL with an opening formed in the passivation layer, wherein a portion of a top surface of the RDL and a sidewall of the RDL are exposed through the opening. A metal finish is formed in the opening and contacting the portion of the top surface and the sidewall of the RDL.

In accordance with another aspect of the present invention, an integrated circuit structure includes a semiconductor substrate including a front side and a backside. A TSV penetrates the semiconductor substrate, wherein the TSV has a back end extending beyond the backside of the semiconductor substrate. An RDL is over the backside of the semiconductor substrate and connected to the back end of the TSV. The RDL includes an RDL strip contacting the TSV; and an RDL pad having a greater width than the RDL strip. The integrated circuit structure further includes a passivation layer over the RDL; an opening in the passivation layer, wherein substantially all sidewalls of the RDL pad are exposed through the opening; and a metal finish layer in the opening and contacting the sidewall of the RDL pad. The metal finish layer contacts substantially all sidewalls of the RDL pad. A top surface of the metal finish layer is higher than a top surface of the passivation layer.

In accordance with yet another aspect of the present invention, an integrated circuit structure includes a semiconductor substrate having a front side and a backside; and a TSV penetrating the semiconductor substrate. The TSV has a back end extending beyond the backside of the semiconductor substrate. An RDL is over the backside of the semiconductor substrate and connected to the back end of the TSV. The RDL has a tapered profile with a top portion of the RDL being narrower than a respective bottom portion of the RDL. The integrated circuit structure further includes a passivation layer over the RDL; and an opening in the passivation layer. A portion of the RDL is exposed through the opening. A metal finish is formed in the opening and contacting the portion of the RDL. The metal finish layer may include a nickel layer, a palladium layer, and/or a gold layer.

The advantageous features of the present invention include improved adhesion between metal finishes and RDLs. In addition, it is easier to clean the residues, resulting in a more reliable bonding structure.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel backside connection structure connecting to through-silicon vias (TSVs) and the method of forming the same are provided. The intermediate stages of manufacturing a preferred embodiment of the present invention are illustrated. The variations of the preferred embodiments are discussed. Throughout the various views and illustrative embodiments of the present invention like reference numbers are used to designate like elements.

Figure 1:
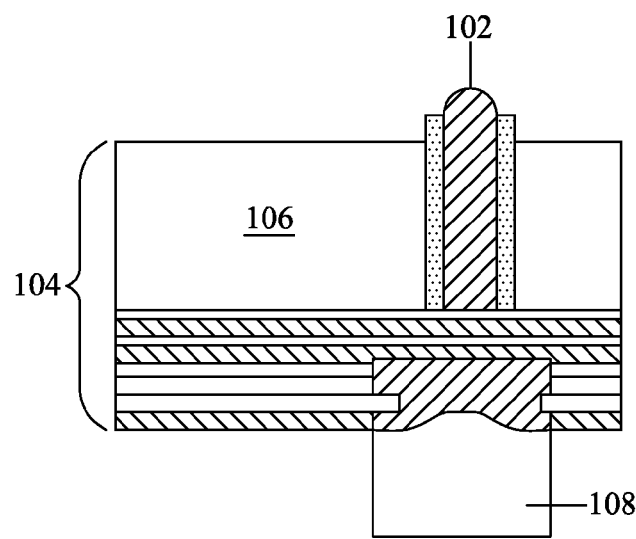
FIG. 1 illustrates a conventional integrated circuit structure including a through-silicon via (TSV), wherein the TSV protrudes through the backside of a substrate, and is bonded to a bond pad on another chip in the form of a copper post.
Figure 2:
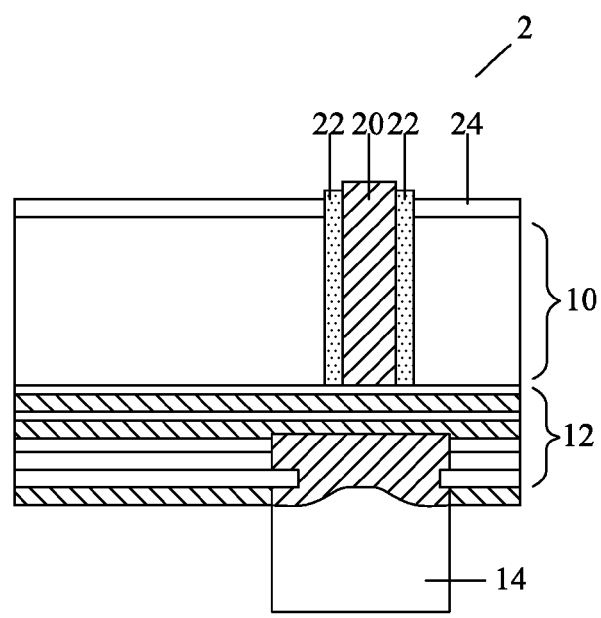
FIGS. 2 through 8 are top views and cross-sectional views of intermediate stages in the manufacturing of an embodiment of the present invention.

Referring to FIG. 2, chip 2, which includes substrate 10 and integrated circuits (not shown) therein, is provided. Substrate 10 is preferably a semiconductor substrate, such as a bulk silicon substrate, although it may include other semiconductor materials such as group III, group IV, and/or group V elements. Semiconductor devices, such as transistors (not shown), may be formed at the front surface (the surface facing down in FIG. 2) of substrate 10. Interconnect structure 12, which includes metal lines and vias (not shown) formed therein, is formed under substrate 10 and connected to the semiconductor devices. The metal lines and vias may be formed of copper or copper alloys, and may be formed using the well-known damascene processes. Interconnect structure 12 may include commonly known inter-layer dielectric (ILD) and inter-metal dielectrics (IMDs). Bond pad 14 is formed on the front side (the side facing down in FIG. 2) of, and protrudes beyond, the front surface of chip 2.

TSV 20 is formed in substrate 10, and extends from the back surface (the surface facing up in FIG. 2) to the front surface (the surface with active circuits formed thereon). In a first embodiment, as shown in FIG. 2, TSV 20 is formed using a via-first approach, and is formed before the formation of interconnect structure 12. Accordingly, TSV 20 only extends to the ILD that is used to cover the active devices, but not into the IMD layers in interconnect structure 12. In alternative embodiments, TSV 20 is formed using a via-last approach, and is formed after the formation of interconnect structure 12. Accordingly, TSV 20 penetrates through both substrate 10 and interconnect structure 12. Isolation layer 22 is formed on the sidewalls of TSV 20 and electrically insulates TSV 20 from substrate 10. Isolation layer 22 may be formed of commonly used dielectric materials such as silicon nitride, silicon oxide (for example, tetra-ethyl-ortho-silicate (TEOS) oxide), and the like.

TSV 20 is exposed through, and protrudes out of, the back surface of substrate 10. Preferably, backside isolation layer 24 is formed covering the backside of substrate 10. In an exemplary embodiment, the formation of backside isolation layer 24 includes etching the back surface of substrate 10, blanket forming backside isolation layer 24, and lightly performing a chemical mechanical polish to remove the portion of backside isolation layer 24 directly over TSV 20. Accordingly, TSV 20 is exposed through an opening in backside isolation layer 24. In alternative embodiments, the opening in backside isolation layer 24, through which TSV 20 is exposed, is formed by etching.

Figure 3:
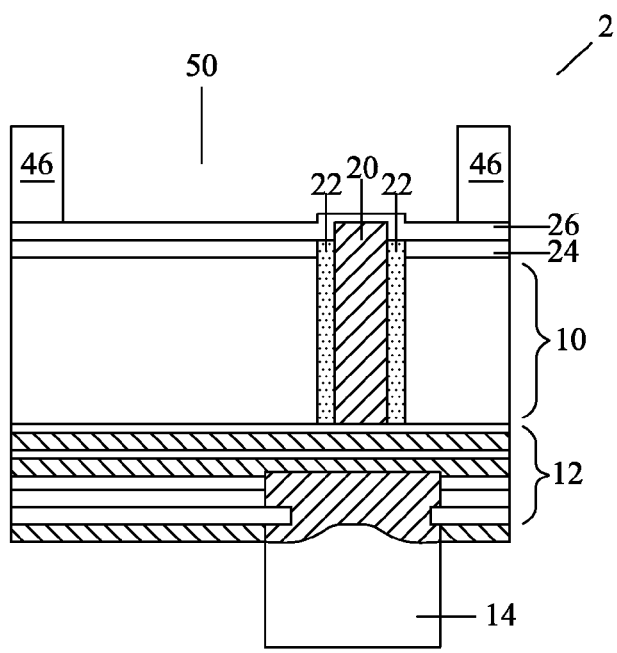

Referring to FIG. 3, thin seed layer 26, also referred to as an under-bump metallurgy (UBM), is blanket formed on backside isolation layer 24 and TSV 20. The usable materials of UBM 26 include copper or copper alloys. However, other metals, such as silver, gold, aluminum, and combinations thereof, may also be included. In an embodiment, UBM 26 is formed using sputtering. In other embodiments, physical vapor deposition (PVD) or electro plating may be used.

FIG. 3 also illustrates the formation of mask 46. Mask 46 may be formed of a photoresist, which may be a dry film or a liquid photo resist. Mask 46 is then patterned to form opening 50 in mask 46, with TSV 20 being exposed through opening 50.

Figure 4:
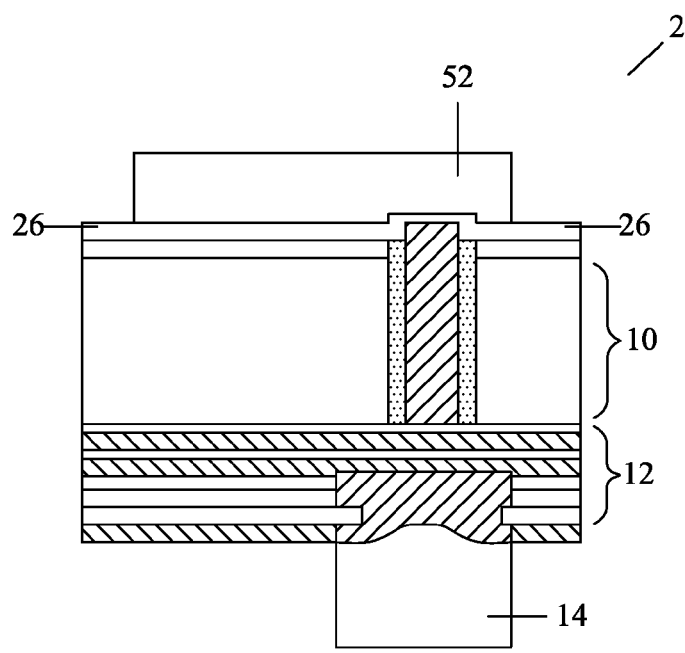

In FIG. 4, opening 50 is selectively filled with a metallic material, forming redistribution line (RDL) 52 in opening 50. Since TSV 20 protrudes out of the back surface of substrate 10, TSV 20 extends into RDL 52. This advantageously increases the strength of the joint between TSV 20 and RDL 52. In an embodiment, the filling material includes copper or copper alloys, although other metals, such as aluminum, silver, gold, and combinations thereof, may also be used. The formation methods preferably include electro-chemical plating (ECP), electroless plating, or other commonly used deposition methods such as sputtering, printing, and chemical vapor deposition (CVD) methods. Mask 46 is then removed. As a result, the portions of UBM 26 underlying mask 46 are exposed.

Figure 5:
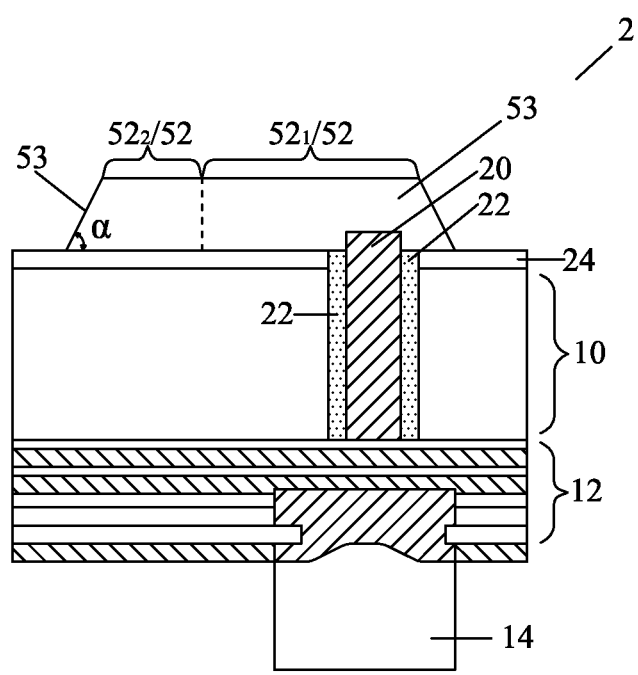
Figure 7A:
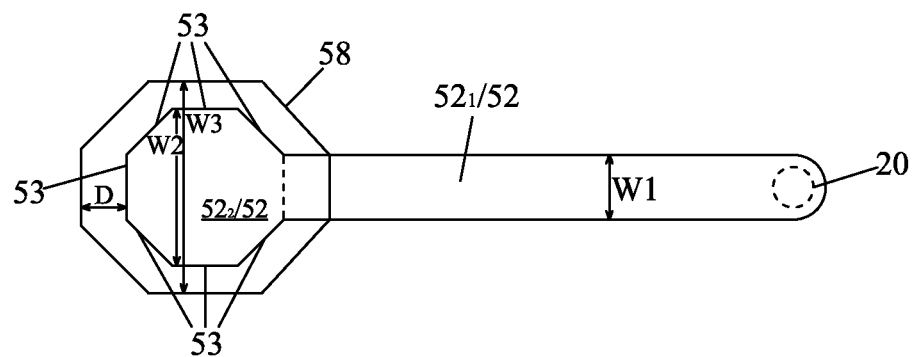
Figure 7B:
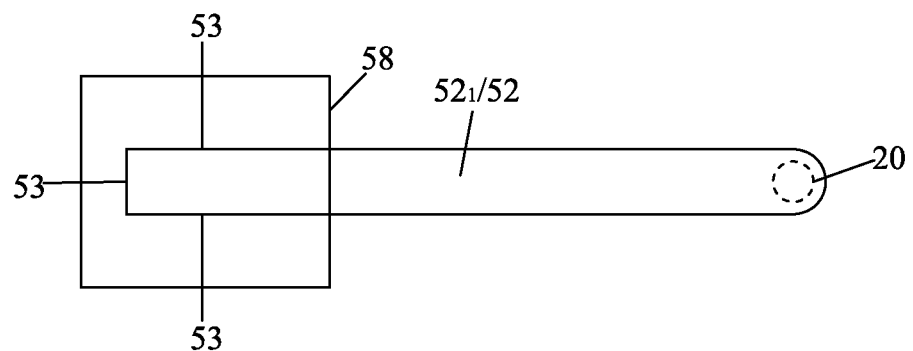

Referring to FIG. 5, the exposed portions of UBM 26 are removed by a flash etching. The remaining RDL 52 may include RDL strip (also referred to as redistribution trace) $52_1$ that includes a portion directly over, and connected to, TSV 20, and optionally RDL pad $52_2$ joining RDL strip $52_1$. The possible top views of RDL 52 are shown in FIGS. 7A and 7B. In FIG. 5 and subsequent figures, UBM 26 is not shown since it is typically formed of similar materials as RDL 52, and thus it appears to be merged with RDL 52. In the preferred embodiment, RDL 52 has a tapered profile, with the top width and top length greater than the respective bottom width and bottom length. In other words, sidewalls 53 of RDL 52 are slanted, with the inner angles α being less than 90 degrees, and more preferably less than about 80 degrees, and even more preferably less than about 70 degrees. Such a tapered profile may be formed by performing an over-etching in the flash etching that is used to remove the exposed portions of UBM 26, for example, by extending the etching time to two times or three times the time needed for removing exposed UBM 26. Advantageously, with RDL 52 having the tapered profile, it is easy to fully remove the undesirable portions of passivation layer 56 during the patterning of passivation layer 56.

Figure 6A:
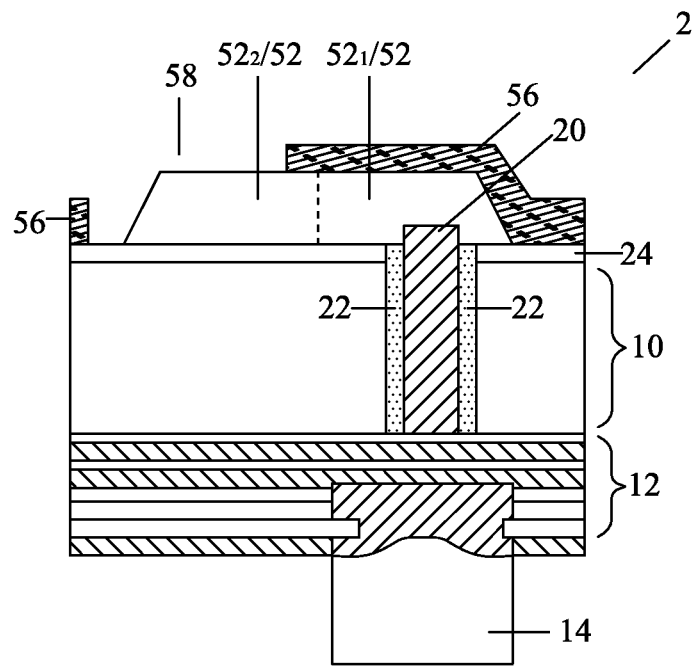
Figure 6B:
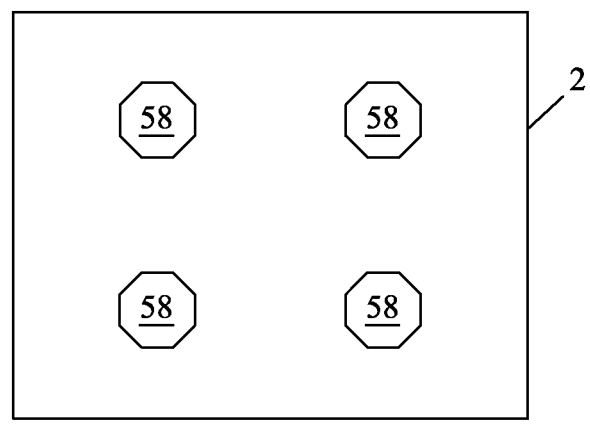

Next as shown in FIG. 6A, passivation layer 56 is blanket formed and patterned to form opening 58. Passivation layer 56 may be formed of nitrides, oxides, polyimide, and the like. A portion of RDL pad $52_2$ is exposed through opening 58 in passivation layer 56. Preferably, besides a center portion of RDL pad $52_2$, sidewalls of RDL pad $52_2$ are also exposed through opening 58. RDL strip $52_1$ remains to be covered by passivation layer 56. It is realized that one chip may include a plurality of TSVs 20, as shown in FIG. 6B, which is a top view of chip 2. In the preferred embodiment, the sizes of openings 58 throughout chip 2 are substantially uniform. The uniform size of openings 58 results in the same amount of solder needed for bonding each of the plurality of TSVs, so that the likelihood of having cold joint or non joint is reduced.

FIG. 7A illustrates a top view of opening 58 and RDL 52. Preferably, at least one sidewall 53 of RDL 52 is exposed through opening 58. Accordingly, the remaining portion of passivation layer 56 is preferably spaced apart from sidewall 53. Opening 58 may have a greater area than RDL pad $52_2$, and hence an entirety (or substantially an entirety, for example, greater than about 90 percent of the area of) of RDL pad $52_2$ is exposed through opening 58. Accordingly, other sidewalls 53 of RDL pad $52_2$ are also exposed. Alternatively, only a portion of RDL pad $52_2$ is exposed. In an exemplary embodiment, RDL strip $52_1$ has width W1 between about 5 µm and about 15 µm. RDL pad $52_2$ has width W2 of about 60 µm to about 80 µm, while opening 58 has width W3 of about 100 µm. Please note that the dimensions of the illustrated features are not in scale. In alternative embodiments, as shown in FIG. 7B, RDL 52 does not have RDL pad $52_2$ that is wider than RDL strip $52_1$. Accordingly, opening 58 only exposes RDL strip $52_1$, which preferably includes an end of RDL strip $52_1$.

Figure 8:
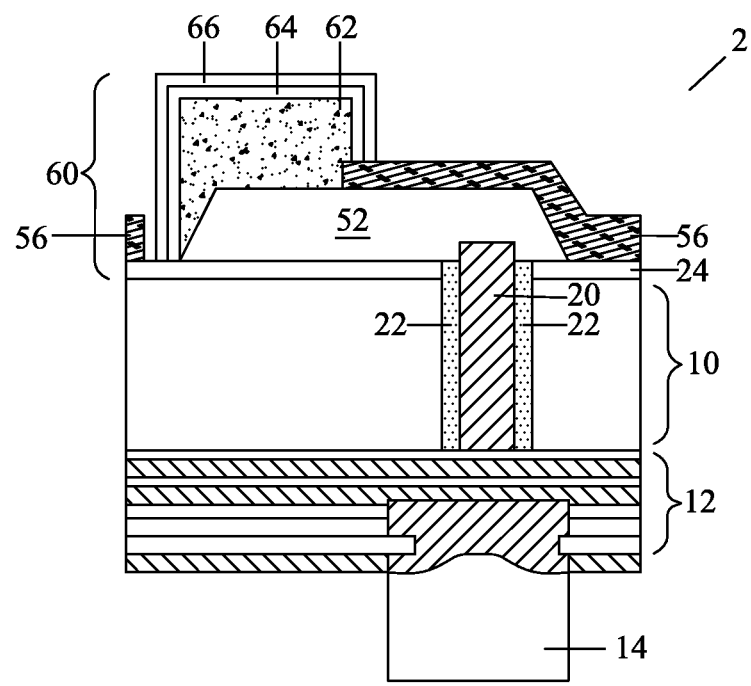

Next, as shown in FIG. 8, metal finish 60 is formed in opening 58. The formation methods of metal finish 60 include ECP, electroless plating, and the like. In the preferred embodiment, metal finish 60 includes nickel layer 62 directly on, and contacting, RDL pad $52_2$. Optionally, addition layers, such as gold layer 66, or gold layer 66 on palladium layer 64, may be formed on nickel layer 62. The thickness of nickel layer 62 is greater than the thickness of passivation layer 56, so that the top surface of nickel layer 62 is higher than the top surface of passivation layer 56. The formation of palladium layer 64 and gold layer 66 further increase the height of metal finish 60, so that the standoff between chip 2 (and the respective wafer in which chip 2 is located), is adequate for the flow of the underfill that will be filled in subsequent packaging steps. With the formation of the metal finish as above-discussed, there is no need to form a copper pad in opening 58, or a eutectic bond pad in opening 58, wherein the eutectic bond pad typically includes an eutectic solder material formed of Sn—Pb alloy, for example.

The embodiments of the present invention have several advantageous features. By forming RDLs with tapered profiles, it is easy to clean residues such as leftovers of passivation layers, particularly at regions close to the sidewalls of the RDLs. With the metal finishes contacting the sidewalls of RDL strips and/or RDL pads, the adhesion between the metal finishes and the respective underlying RDLs is improved, resulting in a more reliable packaging structure.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a through-silicon via (TSV) penetrating through a semiconductor substrate;
   forming a redistribution line (RDL) over a backside of the semiconductor substrate and connected to a back end of the TSV;
   forming a passivation layer over the RDL;
   patterning the passivation layer to form an opening, wherein a top surface of the RDL and a sidewall of the RDL are exposed through the opening; and
   forming a metal finish contacting the top surface and the sidewall of the RDL.

2. The method of claim 1, wherein the step of forming the metal finish comprises plating the metal finish onto the RDL through the opening.

3. The method of claim 1, wherein the RDL has a tapered profile with a top portion of the RDL being narrower than a respective bottom portion of the RDL.

4. The method of claim 3, wherein the step of forming the RDL comprises:
   forming a seed layer on the backside of the semiconductor substrate and electrically connected to the back end of the TSV;
   forming and patterning a mask layer, wherein first portions of the seed layer are not covered by the mask layer;
   forming the RDL by plating a conductive material on the first portions of the seed layer and through the opening;
   removing the mask layer; and
   after the step of removing the mask layer, etching second portions of the seed layer not covered by the mask layer until the RDL has the tapered profile.

5. The method of claim 4, wherein the step of etching the portions of the seed layer comprises:
   etching the seed layer until the second portions of the seed layer not covered by RDL are removed, wherein the step of etching the seed layer takes a first period of time; and
   after the step of etching the seed layer, over-etching the RDL until the RDL has the tapered profile, wherein the step of over-etching takes a second period of time equal to about one time to two times the first period of time.

6. The method of claim 1, wherein the back end of the TSV extends into the RDL.

7. The method of claim 1, wherein the RDL comprises:
   an RDL strip connected to the TSV; and
   an RDL pad having a width greater than a width of the RDL strip, wherein the metal finish contacts a sidewall of the RDL pad.

8. The method of claim 7, wherein substantially all sidewalls of the RDL pad are exposed through the opening, and wherein the metal finish contacts substantially all sidewalls of the RDL pad.

9. The method of claim 1, wherein an edge of the passivation layer facing the sidewall of the RDL is spaced apart from a respective edge of the metal finish.

10. A method comprising:
    forming a through-silicon via (TSV) penetrating through a semiconductor substrate, the TSV comprising a back end extending beyond a backside of the semiconductor substrate;
    forming a redistribution line (RDL) over the backside of the semiconductor substrate and connected to the back end of the TSV, the RDL comprising:
       an RDL strip contacting the TSV; and
       an RDL pad having a greater width than the RDL strip, wherein the RDL pad joins the RDL strip;
    forming a passivation layer over a portion of the RDL, wherein the passivation layer comprises an opening, with substantially all sidewalls of the RDL pad being exposed through the opening; and
    forming a metal finish contacting the substantially all sidewalls of the RDL pad.

11. The method of claim 10, wherein the RDL has a tapered profile with a top portion of the RDL being narrower than a respective bottom portion of the RDL.

12. The method of claim 11, wherein the step of forming the RDL comprises:
    forming a seed layer on the backside of the semiconductor substrate and electrically connected to the back end of the TSV;
    forming and patterning a mask layer to expose first portions of the seed layer through the mask layer;
    forming the RDL by plating a conductive material on the first portions of the seed layer;
    removing the mask layer; and
    after the step of removing the mask layer, etching second portions of the seed layer not covered by the mask layer until the RDL has the tapered profile.

13. The method of claim 12, wherein the step of etching the second portions of the seed layer comprises etching the seed layer until the second portions of the seed layer are removed, and continue to over-etch the RDL until the RDL has the tapered profile.

14. The method of claim 10, wherein a top surface of the metal finish is higher than a top surface of the passivation layer.

15. A method comprising:
    forming a through-silicon via (TSV) penetrating through a semiconductor substrate, the TSV comprising a back end exposed through a backside of the semiconductor substrate;
    forming a redistribution line (RDL) over the backside of the semiconductor substrate and connected to the back end of the TSV, wherein the RDL has a tapered profile with a top portion of the RDL being narrower than a respective bottom portion of the RDL;
    forming a passivation layer over the RDL;
    etching the passivation layer to form an opening in the passivation layer, wherein a portion of the RDL is exposed through the opening; and
    forming a metal finish in the opening and contacting the portion of the RDL exposed through the opening.

16. The method of claim 15, wherein the RDL comprises:
    an RDL strip connected to the TSV; and
    an RDL pad having a width greater than a width of the RDL strip, wherein the RDL pad has a slanted sidewall exposed through the opening in the passivation layer, and wherein the slanted sidewall of the RDL contacts the metal finish.

17. The method of claim 16, wherein after the step of etching the passivation layer, a sidewall of the RDL strip is exposed through the opening, and wherein the metal finish further contacts the sidewall of the RDL strip.

18. The method of claim 16, wherein substantially all sidewalls of the RDL pad contact the metal finish.

19. The method of claim 15, wherein the step of forming the RDL comprises:
    forming a seed layer on the backside of the semiconductor substrate and electrically connected to the back end of the TSV;
    forming and patterning a mask layer, wherein first portions of the seed layer are not covered by the mask layer;
    forming the RDL on the seed layer and through the opening;
    removing the mask layer; and
    after the step of removing the mask layer, etching second portions of the seed layer until the RDL has the tapered profile.

20. The method of claim 19, wherein the step of etching the portions of the seed layer comprises:
    etching the seed layer until the portions of the seed layer not covered by RDL are fully removed, wherein the step of etching the seed layer takes a first period of time; and
    after the step of etching the seed layer, over-etching the RDL until the RDL has the tapered profile, wherein the step of over-etching takes a second period of time equal to between about one time and about two times the first period of time.

* * * * *